March 15, 1966 N. ORENSTEIN ETAL 3,241,086
WIDE-FREQUENCY-RANGE SWEEP GENERATOR
Filed Oct. 23, 1963
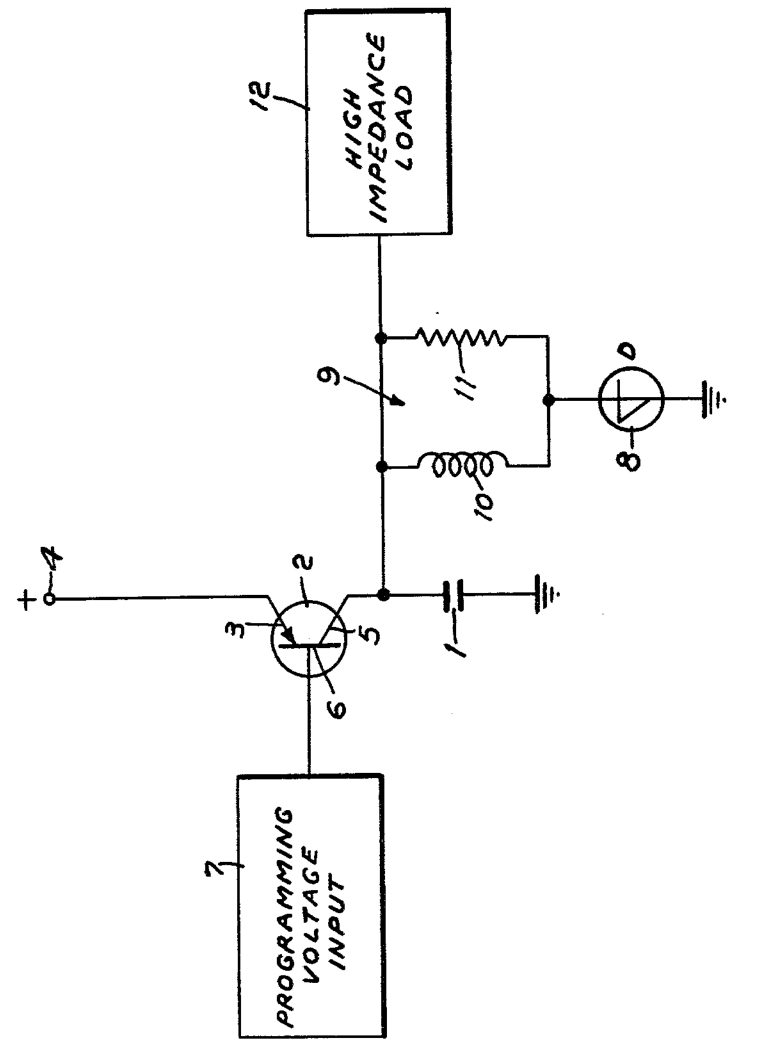
INVENTORS.
NATHAN ORENSTEIN
BRUNO A. CHMIEL
BY Percy P. Lantzy
ATTORNEY 3,241,086
WIDE-FREQUENCY-RANGE SWEEP GENERATOR

Nathan Orenstein, New York, N.Y., and Bruno A. Chmiel, Wayne, N.J., assignors to International Telephone and Telegraph Corporation, Nutley, N.J., a corporation of Maryland Filed Oct. 23, 1963, Ser. No. 318,316
2 Claims. (Cl. 331—107)

This invention relates to sweep circuits and particularly to programmable sweep circuits.

One of the objects of the invention is to provide a programmable sweep generator having a wide frequency range in the order of 2000 to 1.

Another object of the invention is to provide a sweep generator in which the periodicity of the sweep may be made to vary electronically under the control of a programming voltage.

Another object of the invention is to provide a transistorized programmable sweep generator having a wide frequency range.

Other features and objects relating to the arrangement and connection of the various component parts of the generator will be apparent as the description proceeds.

The invention is illustrated in the accompanying drawing which is a circuit diagram of a sweep generator embodying the invention.

Referring now to the figure, the sweep generator comprises a capacitor 1 having a transistor 2 connected in its charging circuit. The transistor is indicated as a PNP transistor having its emitter 3 connected to a source of positive potential, indicated at 4, and its collector 5 connected to one terminal of the capacitor 1, the other terminal of the capacitor being connected to ground.

The base 6 of the transistor 2 is connected to a source 7 which is arranged, in any desired manner, to produce a programming voltage. As different values of this programming voltage appear on the base 6 of the transistor 2, the base-to-emitter voltage will assume corresponding different values. These in turn will determine correspondingly different rates at which the capacitor will be charged. Since the transistor is a constant current device, the charge will be linear, regardless of the charging rate.

In order to produce a sawtooth wave, means is provided to discharge the capacitor at a very rapid rate when the voltage across the capacitor has reached a predetermined value. To do this, we provide a trigger device comprising a PNPN Shockley diode 8 connected across the capacitor in series with an inductance-resistance network 9 comprising an inductor 10 and a parallelly connected resistor 11. The PNPN diode will conduct when the voltage across it reaches a predetermined value. With suitable values of the inductor 10 and resistor 11, to limit the instantaneous current through the diode, the PNPN diode may be arranged to discharge the capacitor 1 in a time in the order of 1.0 microsecond which time will be uniform over a 2000 to 1 frequency range.

The juncture of the collector 5 and capacitor 1 provides the output and is connected to a high impedance load 12.

The voltage across the capacitor 1 in the arrangement described will be a sawtooth with fast flyback. This sawtooth voltage wave will be linear and will have a relatively uniform amplitude over a range extending from 20 milliseconds to 10 microseconds.

From the above it will be seen that we have provided a sweep generator which will produce a linear sawtooth wave having a frequency range of the order of 2000 to 1, as compared to a frequency range of 20 to 1 of presently known sweep generators.

Various modifications may be made in the arrangement of the circuitry and the selection of the component parts without departing from the spirit of the invention, and we do not therefore desire to limit our invention to what has been shown and described, except by the limitations contained in the appended claims.

What we desire to claim and secure by Letters Patent is:

1. A wide-frequency-range sweep generator comprising:

an energy storage device;

charging means coupled to said storage device to cause energy to flow into said storage device at a selected one of a plurality of constant rates having a range in the order of 2000 to 1;

variable voltage control means coupled to said charging means for selecting one of said plurality of constant rates of energy flow over the range of 2000 to 1;

a parallel combination of a resistor and an inductor; and trigger means coupled in parallel with said storage device including a PNPN diode coupled in series with said parallel combination of a resistor and an inductor for discharging said storage device at a very rapid and uniform rate thereby making possible sweep frequencies having a range in the order of 2000 to 1.

2. A wide-frequency-range sweep generator according to claim 1 wherein said charging means comprises:

a PNP transistor;

means coupling the collector of said transistor to said storage device;

means coupling the emitter of said transistor to a source of supply voltage; and means coupling the base of said transistor to said control means.

References Cited by the Examiner

UNITED STATES PATENTS 2,053,536 9/1936 Schlesinger ---------- 331—131

OTHER REFERENCES

Carlson: Electrical Manufacturing, "P-N-P-N Four Layer Diodes," January 1960, pp. 71–78.

Moll et al.: Proc. IRE, "P-N-P-N Transistor Switches," September 1956, pp. 1174–1181.

Stewart: RCA Tech. Notes No. 260, June 1959, 1 page.

ROY LAKE, *Primary Examiner.*

JOHN KOMINSKI, *Examiner.*